United States Patent [19]
Hedayati

[11] Patent Number: 4,749,886
[45] Date of Patent: Jun. 7, 1988

[54] REDUCED PARALLEL EXCLUSIVE OR AND EXCLUSIVE NOR GATE

[75] Inventor: Khosrow Hedayati, San Jose, Calif.

[73] Assignee: Intersil, Inc., Cupertino, Calif.

[21] Appl. No.: 916,869

[22] Filed: Oct. 9, 1986

[51] Int. Cl.$^4$ .................. H03K 19/31; H03K 19/08
[52] U.S. Cl. ............................ 307/471; 307/473; 307/451
[58] Field of Search .............. 307/451, 471, 473, 472; 328/169

[56] References Cited

U.S. PATENT DOCUMENTS 3,781,864 12/1973 Fujita .................................. 307/313
4,006,365 2/1977 Marzin et al. ...................... 307/471

FOREIGN PATENT DOCUMENTS 0019059 2/1977 Japan .
0194617 10/1985 Japan .

OTHER PUBLICATIONS

"Eight-Device Exclusive OR CMOS Circuit" by Z. Deaden et al., vol. 25, No. 5, 10-82 IBM Technical Disclosure Bulletin.

Primary Examiner—Stanley D. Miller
Assistant Examiner—Richard Roseen
Attorney, Agent, or Firm—Stanley C. Corwin; Birgit E. Morris; Henry I. Schanzer

[57] ABSTRACT

A parallel EXCLUSIVE or and EXCLUSIVE NOR gate comprising four tri-inverter circuits in which the input transistors of the tri-inverter circuits are shared.

8 Claims, 3 Drawing Sheets

REDUCED PARALLEL EXCLUSIVE OR AND EXCLUSIVE NOR GATE

BACKGROUND OF THE INVENTION

1. Field of the Invention

The present invention relates to logic circuitry, and more particularly to EXCLUSIVE OR and EXCLUSIVE NOR gates.

2. Description of Related Art

EXCLUSIVE OR logic gates are used in a variety of logic circuits including arithmetic function generators such as array multipliers, arithmetic logic units and the like. EXCLUSIVE NOR is a related function which may be produced by inverting the output of an EXCLUSIVE OR gate. Alternatively, a separate logic gate can be utilized to provide the EXCLUSIVE NOR function.

To increase the speed of operation, many logic circuits have a parallel structure in which both EXCLUSIVE OR and EXCLUSIVE NOR gates operate simultaneously to provide the EXCLUSIVE OR and EXCLUSIVE NOR function outputs at the same time. However, this parallel structure generally acquires more space. As a consequence, the increase in speed may cause the overall logic circuit to be larger or to have a reduced number of functions.

SUMMARY OF THE INVENTION

It is an object of the present invention to provide a parallel EXCLUSIVE OR and EXCLUSIVE NOR circuit of reduced size and complexity.

These and other objects and advantages are achieved in a parallel EXCLUSIVE OR and EXCLUSIVE NOR gate in which, in accordance with the present invention, the number of transistors has been reduced. In the illustrated embodiment, the parallel EXCLUSIVE OR and EXCLUSIVE NOR gate comprises a plurality of tri-inverters, each of which includes two series-connected P-channel transistors. The term "tri-inverter" as used herein refers to a tri-state circuit of the type shown, for example, in FIG. 2 having two binary inputs (e.g. I and E). One input (e.g. I) may be arbitrarily referred to as an inverting input and the other input (e.g. E and $\overline{E}$) may be arbitrarily referred to as an enabling input. When the tri-state circuit is enabled, (i.e. with reference to FIG. 2, $\overline{E}$ is low and E is high) the circuit functions as an inverter. That is, the output (O) has a value which is the complement or inverse of the input signal (I). When the circuit is disabled (i.e. for the circuit of FIG. 2, E is low and $\overline{E}$ is high) the circuit is in its "third" state in which event the output appears as a high impedance output regardless of the value of the input signal (I). In the "third" state one or more of the transistors connecting the output (O) to the power terminals (i.e. $V_{DD}$ or ground) is turned-off. Therefore, there is a very high impedance path between the output (O) and the two power terminals connected in series with two series-connected N-channel transistors. In accordance with the present invention, the functions of the input transistors of the tri-inverters of the EXCLUSIVE OR and EXCLUSIVE NOR portions may be shared so that the overall number of transistors is reduced.

These and other objects and advantages will be made more clear in connection with the detailed description of the following drawings.

DETAILED DESCRIPTION OF THE DRAWINGS

Figure 1:
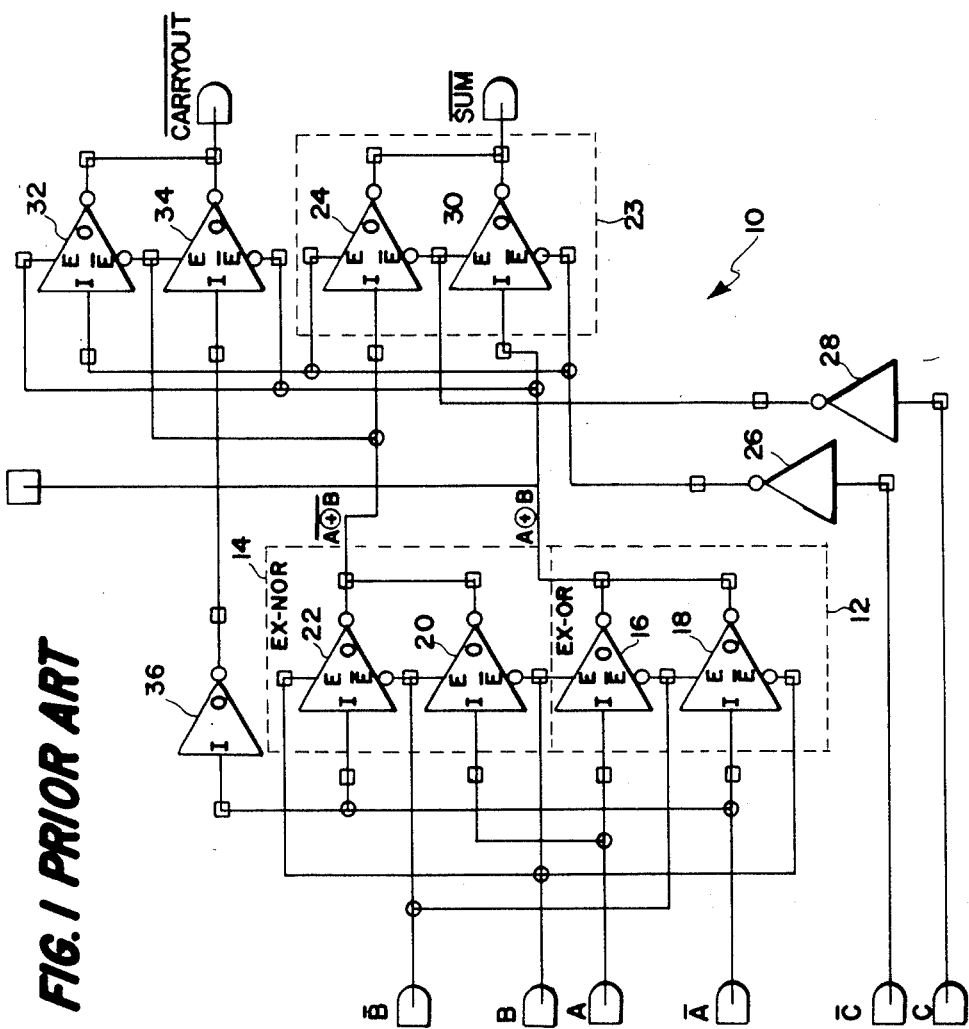
FIG. 1 is a prior art schematic diagram of a full adder circuit utilizing parallel EXCLUSIVE OR and EXCLUSIVE NOR gates.
Figure 2:
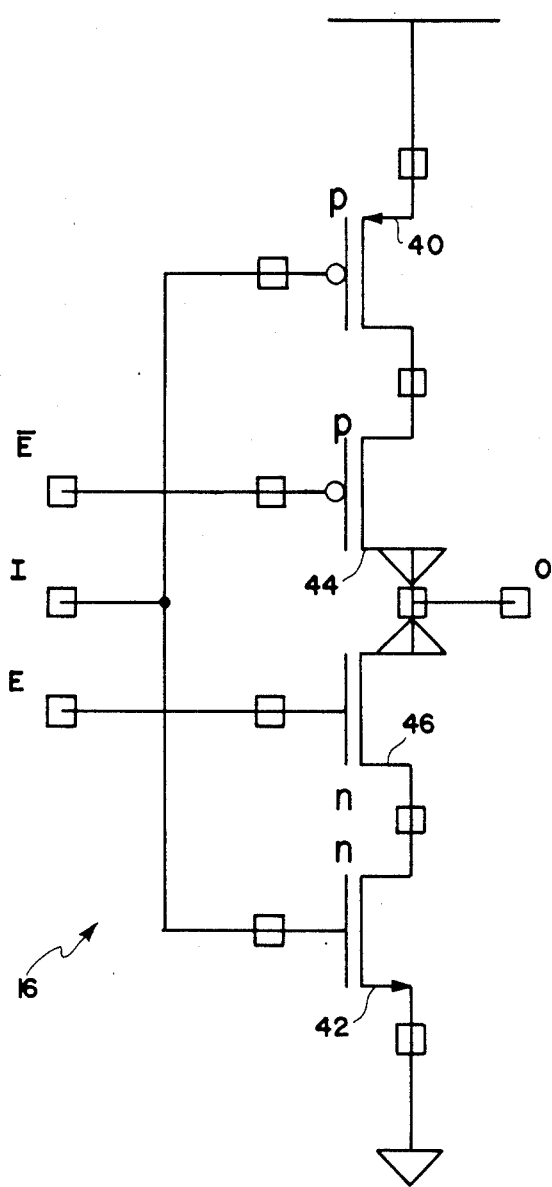
FIG. 2 is a prior art schematic diagram of a tri-inverter circuit of the adder circuit of FIG. 1.

Referring first to FIG. 1, a full adder circuit for adding three binary signals, A, B, and the carry input C, is indicated generally at 10. The adder circuit 10 includes an EXCLUSIVE OR circuit 12 and a parallel EXCLUSIVE NOR circuit 14. The EXCLUSIVE OR circuit 12 and EXCLUSIVE NOR circuit 14 comprise a plurality of tri-inverter logic gates, an example of which is illustrated in FIG. 2. As will be made more clear in the following discussion, the present invention reduces the number of transistors required for a parallel EXCLUSIVE OR and EXCLUSIVE NOR logic gate. As a consequence, more adder circuits such as that shown in FIG. 1 may be packed into an integrated circuit of a given size thereby increasing the capabilities of the integrated circuit.

The adder circuit 10 has a two-bit output, the least significant bit of which is designated $\overline{SUM}$ and the most significant bit being designated $\overline{CARRY\ OUT}$. The adder circuit 10 utilizes the outputs of the EXCLUSIVE OR circuit 12 and the EXCLUSIVE NOR circuit 14, together with selected input signals to generate the two-bit output, $\overline{SUM}$ and $\overline{CARRY\ OUT}$. The EXCLUSIVE OR gate 12 comprises two tri-inverter gates 16 and 18, each of which has an input I, an output O, an enable input E, and an inverted enable input $\overline{E}$. Each tri-inverter inverts the input I when the enable input E is true (that is, when input E is at a logical one represented by a high voltage state). The inputs I of the tri-inverters 16 and 18 are connected to the signal input A and its complement $\overline{A}$, respectively. The enable inputs E of the tri-inverters 16 and 18 are connected to the input signal B and its complement $\overline{B}$ respectively. Conversely, the inverted enable inputs $\overline{E}$ of the tri-inverters 16 and 18 are connected to the complemented input signal $\overline{B}$ and the input signal B, respectively. The outputs 0 of the tri-inverters 16 and 18 are connected together to provide a single output, the EXCLUSIVE OR function of the signals A and B as indicated in FIG. 1.

The EXCLUSIVE NOR circuit 14 similarly comprises two tri-inverter gates 20 and 22 having inputs I connected to the signal A and its complement $\overline{A}$, respectively. The enable inputs E of the tri-inverters 20 and 22 are connected to the complemented input signal $\overline{B}$ and the input signal B while the inverted enable input $\overline{E}$ of each is connected to the input signal B and is complement $\overline{B}$, respectively. The output O of the tri-inverters 20 and 22 are connected together to provide a single output, the EXCLUSIVE NOR function as illustrated in FIG. 1.

The adder circuit 10 further comprises a second EXCLUSIVE NOR circuit 23 which includes a tri-inverter gate 24 having an input I connected to the output of the EXCLUSIVE NOR circuit 14. The tri-inverter gate 24 is enabled by the carry input signal C and its complement $\overline{C}$ which are coupled by inverters 26 and 28 to the enable and inverted enable inputs, E and $\overline{E}$ respectively, of the tri-inverter 24. The carry input signals C and $\overline{C}$ also enable another output tri-inverter 30 which has an input I coupled to the output of the EXCLUSIVE OR circuit 12. The outputs O of the inverters 24 and 30 are connected together to provide the adder circuit output $\overline{SUM}$ which is the complement of the least significant bit of the binary sum of the binary input signals, A, B, and C.

A tri-inverter 32 is enabled by the outputs of the EXCLUSIVE OR circuit 12 and the EXCLUSIVE NOR circuit 14 connected to the enable inputs E and $\overline{E}$, respectively. The tri-inverter 32 further has an input I connected to the output of the carry input signal C inverter 26. An additional tri-inverter gate 34 is enabled by the outputs of the EXCLUSIVE NOR circuit 14 and the EXCLUSIVE OR circuit 12, respectively, and has an input I coupled to the output of an inverter 36 which has an input connected to the input signal A. The outputs of the tri-inverters 32 and 34 are connected together to provide the adder output $\overline{CARRY\ OUT}$ which is the complement of the more significant bit of the binary sum of the binary input signals A, B and C.

FIG. 2 shows a more detailed schematic diagram of the tri-inverter gate 16 of the EXCLUSIVE OR circuit 12. In many previous adder circuits, the construction of the tri-inverter 16 is representative of the construction of the other tri-inverter gates of the adder circuit 10. The tri-inverter circuit 16 includes a p-channel metal oxide semiconductor field effect transistor (MOSFET) 40 and an n-channel MOSFET 42. The gates of the MOSFETs 40 and 42 are tied to the tri-inverter input I. The drain of the p-channel input MOSFET 40 is connected to the source of a second p-channel MOSFET 44, the gate of which is connected to the tri-inverter enable input $\overline{E}$. Similarly, the drain of the n-channel input MOSFET 42 is connected to the source of a second n-channel MOSFET 46, the gate of which is connected to the tri-inverter enable input E. The drains of the enable transistors 44 and 46 are tied to a common output O.

In operation, when the enable input E is true (logic 1 represented by a relatively high voltage), the voltage at the output O represents the logical inverse of the voltage at the input I. Specifically, a high voltage at enable input E and a low voltage at enable input $\overline{E}$ turns on both the enable transistors 46 and 44, respectively. However, only one of the input transistors 40 or 42 is turned on depending upon the logic state (i.e., the voltage level) of the input I. If the input I is not true (logical 0 represented by low voltage), the input transistor 40 is turned on which allows the voltage at the output O to rise to the supply voltage (representing the logic state true or 1) when enable input E is true. Conversely, if the input I is at a logical 1 state, the input transistor 42 is turned on pulling the output O towards ground when the enable input E is true.

As seen from the above, the tri-inverter 16 utilizes 4 transistors. Consequently, a parallel EXCLUSIVE OR and EXCLUSIVE NOR gate which utilizes 4 such tri-inverters as indicated at 12 and 14 in FIG. 1 would therefore utilize 16 transistors. These 16 transistors would in general require considerably more space than a non-parallel EXCLUSIVE OR and EXCLUSIVE NOR gate which merely inverts the output of an EXCLUSIVE OR gate to provide both functions. Thus, the increased speed of a parallel EXCLUSIVE OR and EXCLUSIVE NOR gate has previously been achieved at the expense of a significant increase in the size and complexity of the integrated circuit.

Figure 3:
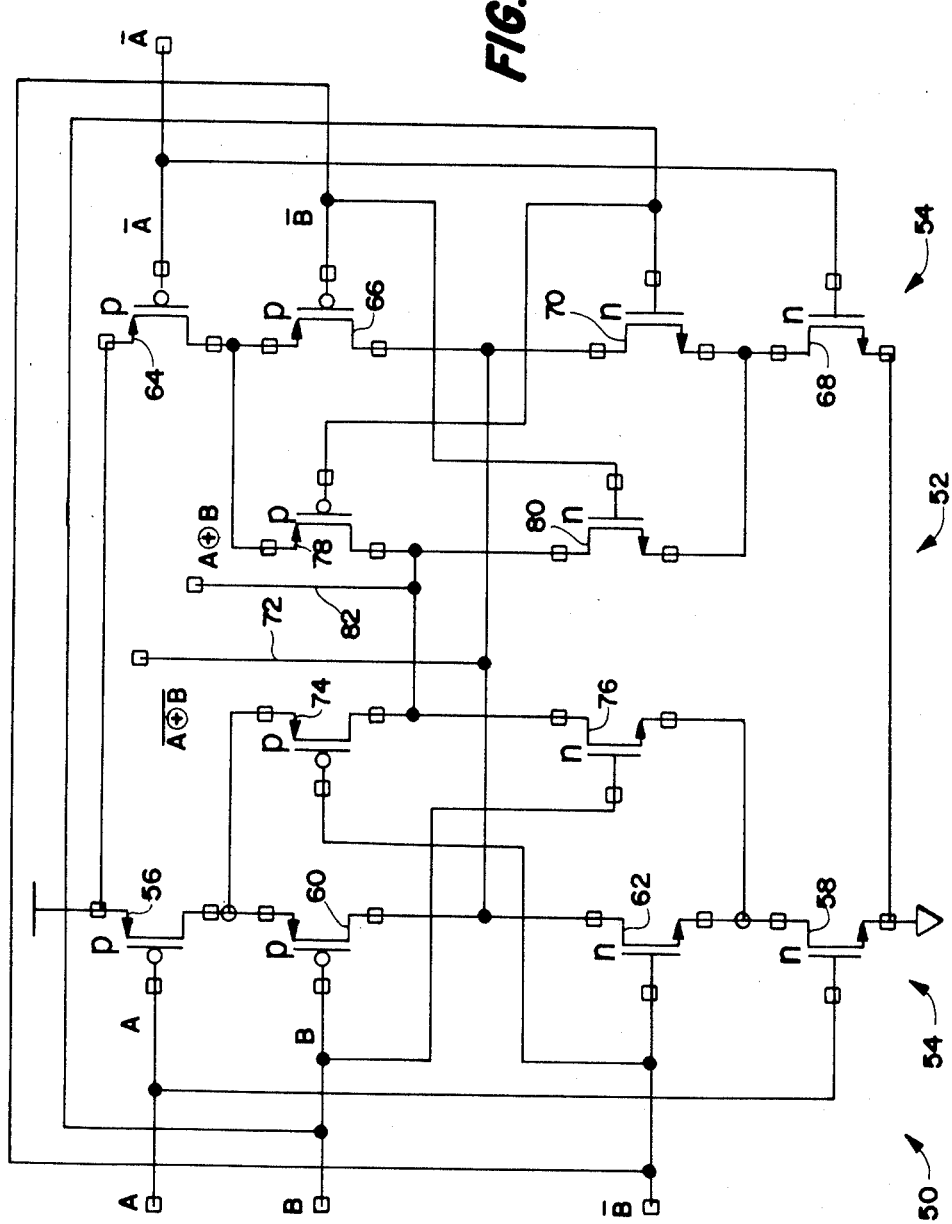
FIG. 3 is a schematic diagram of a parallel EXCLUSIVE OR and EXCLUSIVE NOR logic gate in accordance with a preferred embodiment of the present invention.

In accordance with the present invention, the speed of a parallel EXCLUSIVE OR and EXCLUSIVE NOR gate may be maintained while minimizing the number of transistors. FIG. 3 illustrates an embodiment of the invention in which 4 transistors of a parallel EXCLUSIVE OR and EXCLUSIVE NOR gate 50 have been eliminated. The gate 50 includes an EXCLUSIVE OR circuit 52 and an EXCLUSIVE NOR circuit 54. The EXCLUSIVE NOR circuit 54 comprises a first tri-inverter which includes a p-channel input MOSFET 56 and an n-channel input MOSFET 58. The gates of both input transistors 56 and 58 are coupled to the signal input A. The first tri-inverter circuit further includes a p-channel enable MOSFET 60 coupled to the drain of the p-channel input MOSFET 56, and an n-channel enable MOSFET 62 coupled to the drain of the n-channel input transistor 58. The gates of the enable MOSFETs 60 and 62 are connected to the signal inputs B and $\overline{B}$, respectively. The EXCLUSIVE NOR circuit 54 further comprises a second tri-inverter circuit which includes series connected p-channel input and enable MOSFETs 64 and 66 and n-channel input and enable MOSFETs 68 and 70. The gates of the input MOSFETs 64 and 68 are connected to the signal input $\overline{A}$ and the gates of the enable MOSFETs 66 and 70 are connected to the signal inputs $\overline{B}$ and B, respectively. The outputs of the enable MOSFETs 60, 62, 66 and 70 of the EXCLUSIVE NOR circuit 54 are connected together to provide a single output 72. In accordance with the EXCLUSIVE NOR function, the output 72 is at a logical one state if both of the A and B inputs are true, or if neither of the A and B inputs is true. Alternatively, if either of the inputs A or B is true (but not both), the output at 72 is at a logical low state.

The EXCLUSIVE OR circuit 52 comprises third and fourth tri-inverter circuits of the gate 50. In accordance with the present invention, the input transistors of the tri-inverter circuits of the EXCLUSIVE NOR circuit 54 may be shared by the tri-inverter circuits of the EXCLUSIVE OR circuit 52 so that the need for 4 additional input transistors for the EXCLUSIVE OR circuit 52 has been eliminated. Specifically, the third tri-inverter circuit of the EXCLUSIVE OR circuit 52 comprises the p-channel input transistor 56 and a p-channel enable MOSFET 74 coupled to the drain of the p-channel input transistor 56. In this manner, the enable transistors 60 and 74 of the EXCLUSIVE NOR and EXCLUSIVE OR logic circuits 54 and 52, respectively, "share" the p-channel input transistor 56. Note, the gate of the p-channel enable transistor 74 of the EXCLUSIVE OR circuit 52 is connected to the input signal $\overline{B}$ while the p-channel enable transistor 60 of the EXCLUSIVE NOR circuit 54 is connected to the complementary input signal B. Thus, the enable transistors 60 and 74 of the EXCLUSIVE NOR and EXCLUSIVE OR circuits 54 and 52, respectively, will not be turned on at the same time.

The third inverter circuit of the EXCLUSIVE OR circuit 52 also comprises the n-channel input transistor 58 of the EXCLUSIVE NOR circuit 54, and an n-channel enable MOSFET 76 connected to the drain of the n-channel input transistor 58. The gate of the n-channel enable transistor 76 is connected to the input signal B while the corresponding n-channel enable transistor 62 of the EXCLUSIVE NOR circuit 54 is connected to the complementary input signal B̄. Thus, the n-channel enable transistors 62 and 76 of the EXCLUSIVE NOR and EXCLUSIVE OR circuits 54 and 52, respectively, share the same n-channel input transistor 58 as shown in FIG. 3.

Similarly, the fourth tri-inverter circuit of the EXCLUSIVE OR circuit 52 comprises a p-channel enable MOSFET 78 which shares the p-channel input transistor 64 with the p-channel enable transistor 66 of the EXCLUSIVE NOR circuit 54. The gates of the p-channel enable transistors 78 and 66 are connected to the control signals B and B̄, respectively, such that the p-channel enable transistors 78 and 66 are not turned on at the same time.

Finally, an n-channel enable MOSFET 80 of the fourth tri-inverter circuit shares the n-channel input transistor 68 with the p-channel enable transistor 70 of the EXCLUSIVE NOR circuit 54. The gates of the p-channel enable transistors 80 and 70 are connected to the complementary control signals B̄ and B such that they are not turned on at the same time. The drains of the enable transistors 74, 78, 76 and 80 of the EXCLUSIVE OR circuit 54 are connected together to provide a single EXCLUSIVE OR output 82 as shown in FIG. 3.

To illustrate the operation of the parallel gate 50, it may be assumed, for example, that the binary input signals A and B are both at a true or logical one state represented by a high voltage. Consequently, the p-channel input transistor 56 is turned off and the n-channel input transistor 58 is turned on. When the input signal B is true, the n-channel enable transistor 62 of the EXCLUSIVE NOR circuit 54 is turned off so that the state of the n-channel input transistor 58 does not affect the output of the EXCLUSIVE NOR circuit 54. However, the n-channel enable transistor 76 of the EXCLUSIVE OR circuit 52 is turned on so that the output 82 of the EXCLUSIVE OR circuit 52 is pulled to ground (logical zero) which is consistent with the EXCLUSIVE OR function.

On the other side of the gate 50, the n-channel input transistor 68 is turned off while the p-channel input transistor 64 is turned on. When the input signal B is true, the p-channel enable transistor 78 of the EXCLUSIVE OR circit 52 is turned off while the p-channel enable transistor 66 of the EXCLUSIVE NOR circuit 54 is turned on. Consequently, the output 72 of the EXCLUSIVE NOR circuit 54 is pulled up to the supply voltage (logic one) consistent with the EXCLUSIVE NOR function. The operation of the logic gate 50 resulting from the other possible logic states of the input signals A and B should be readily apparent.

It is clear from the above that a parallel EXCLUSIVE OR and EXCLUSIVE NOR circuit in accordance with the present invention provides both EXCLUSIVE OR and EXCLUSIVE NOR outputs simultaneously while requiring fewer transistors than previous EXCLUSIVE OR and EXCLUSIVE NOR circuits utilizing four complete tri-inverters. It will, of course, be understood that modifications of the present invention, in its various aspects, will be apparent to those skilled in the art, some being apparent only after study and others being merely matters of routine electronic design. For example, transistors other than MOSFETs may be utilized. Other embodiments are also possible, with their specific designs being dependent upon the particular application. As such, the scope of the invention should not be limited by the particular embodiment herein described but should be defined only by the appended claims and the equivalents thereof.

I claim:

1. A parallel EXCLUSIVE OR and EXCLUSIVE NOR circuit comprising:
    a first circuit input for a binary signal A;
    a second circuit input for a binary signal Ā, the complement of the binary signal A;
    a third circuit input for a binary signal B;
    a fourth circuit input for a binary signal B̄, the complement of the binary signal B;
    a first circuit output;
    a second circuit output;
    a first p-channel input transistor having an input adapted to be connected to a first supply voltage source, a gate coupled to the first circuit input, and an output;
    first and second p-channel enable transistors each having an input coupled to the output of the first p-channel input transistor, said first p-channel enable transistor having a gate coupled to the third circuit input and an output coupled to the first circuit output, said second p-channel enable transistor having a gate coupled to the fourth circuit input and an output coupled to the second circuit output;
    a first n-channel input transistor having an input adapted to be coupled to a second supply voltage source, a gate coupled to the first circuit input and an output;
    first and second n-channel enable transistors each having an input coupled to the output of the first n-channel input transistor, said first n-channel enable transistor having a gate coupled to the fourth circuit input and an output coupled to the first circuit output, said second n-channel enable transistor having a gate coupled to the third circuit input and an output coupled to the second circuit output;
    a second p-channel input transistor having an input adapted to be coupled to the first supply voltage source, a gate coupled to the second circuit input, and an output;
    third and fourth p-channel enable transistors each having an input coupled to the output of the second p-channel input transistor, said third p-channel enable transistor having a gate coupled to the fourth circuit input and an output coupled to the first circuit output, said fourth p-channel enable transistor having a gate coupled to the third circuit input and an output coupled to the second circuit output;
    a second n-channel input transistor having an input adapted to coupled to the second supply voltage source, a gate coupled to the second circuit input, and an output;
    third and fourth n-channel enable transistors each having an input coupled to the output of the second n-channel input transistor, said third n-channel enable transistor having a gate coupled to the third circuit input and an output coupled to the first circuit output, said fourth n-channel enable transistor having a gate coupled to the fourth circuit input and an output coupled to the second circuit output.

2. The combination comprising:
    first and second terminals for the application therebetween of an operating potential;

first, second and third transistors, each transistor having first and second electrodes defining the ends of a conduction path and a control electrode;

means connecting the conduction path of said first transistor between said first power terminal and a first node;

means connecting the conduction path of said second transistor between said first node and a first output terminal;

means connecting the conduction path of said third transistor between said first node and a second output terminal;

means for applying a first signal to the control electrode of said first transistor;

means for applying a second signal to be control electrode of said second transistor;

means for applying the complement of said second signal to the control electrode of said third transistor; and means coupling said first and second output terminals to said second power terminal.

3. The combination as claimed in claim 2 further including fourth, fifth and sixth transistors of same conductivity type as said first, second and third transistors, each transistor having first and second electrodes defining the ends of a conduction path and a control electrode;

means connecting the conduction path of said fourth transistor between said first power terminal and a second node;

means connecting the conduction path of said fifth transistor between said second node and said first output terminal;

means connecting the conduction path of said sixth transistor between said second node and said second output terminal;

means for applying the complement of said first signal to the control electrode of said fourth transistor;

means for applying the complement of said second signal to the control electrode of said fifth transistor; and means for applying said second signal to the control electrode and said sixth transistor.

4. The combination as claimed in claim 2 further including fourth, fifth and sixth transistors, each transistor having first and second electrodes defining the ends of a conduction path and a control electrode;

means connecting the conduction path of said fourth transistor between one of said first and second power terminals and a second node;

means connecting the conduction path of said fifth transistor between said second node and said first output terminal;

means connecting the conduction path of said sixth transistor between said second node and said second output terminal;

means for applying one of said first signal and the complement of said first signal to the control electrode of said fourth transistor; and means for applying said second signal to the control electrode of one of said fifth and sixth transistors, and means for applying the complement of said second signal to the control electrode of the other one of said fifth and sixth transistors.

5. The combination as claimed in claim 4 wherein said fourth, fifth and sixth transistors are of the same conductivity type as said first, second and third transistors, wherein the conduction path of said fourth transistor is connected between said first power terminal and said second node;

wherein said second signal is applied to be control electrode of said sixth transistor; and wherein the complement of said second signal is applied to the control electrode of said fifth transistor.

6. The combination as claimed in claim 4 wherein said fourth, fifth and sixth transistors are of complementary conductivity type to said first, second and third transistors; and wherein the conduction path of said fourth transistor is connection between said second power terminal and said second node.

7. The combination as claimed in claim 2 wherein said means coupling said first and second output terminals to said second power terminal includes:

(a) fourth, fifth and sixth transistors of complementary conductivity type to said first, second and third transistors, each one of said fourth, fifth and sixth transistors having first and second electrodes defining the ends of a conduction path and a control electrode;

(b) means connecting the conduction path of said fourth transistor between said second power terminal and a second node;

(c) means connecting the conduction path of said fifth transistor between said second node and said first output terminal;

(d) means connecting the conduction path of said sixth transistor between said second node and said second output terminal;

(e) means for applying said first signal to the control electrode of said fourth transistor;

(f) means for applying the complement of said second signal to the control electrode of said fifth transistor; and (g) means for applying said second signal to the control electrode of said sixth transistor.

8. The combination as claimed in claim 3 wherein said means coupling said first and second output terminals to said second power terminal includes:

(a) seventh through twelfth transistors of complementary conductivity type to said first through sixth transistors, each one of said seventh through twelfth transistors having first and second electrodes defining the ends of a conduction path and a control electrode;

(b) means connecting the conduction path of said seventh transistor between said second power terminal and a third node;

(c) means connecting the conduction path of said eighth transistor between said third node and said first output terminal;

(d) means connecting the conduction path of said ninth transistor between said third node and said second output terminal;

(e) means for applying said first signal to the control electrode of said seventh transistor;

(f) means for applying the complement of said second signal to the control electrode of said eighth transistor;

(g) means for applying said second signal to the control electrode of said ninth transistor;

(h) means connecting the conduction path of said tenth transistor between said second power terminal and a fourth node;

(i) means connecting the conduction path of said eleventh transistor between said fourth node and said first output terminal;
(j) means connecting the conduction path of said twelfth transistor between said fourth node and said second output terminal;
(k) means for applying the complement of said first signal to the control electrode of said tenth transistor;
(l) means for applying the complement of said second signal to the control electrode of said twelfth transistor;
(m) means for applying said second signal to the control electrode of said eleventh transistor;

* * * * *